US007009327B2

(12) United States Patent
Okazawa et al.

(10) Patent No.: US 7,009,327 B2
(45) Date of Patent: Mar. 7, 2006

(54) PIEZOELECTRIC ELEMENT FORMATION MEMBER, METHOD OF MANUFACTURING THE SAME, PIEZOELECTRIC ACTUATOR UNIT AND LIQUID EJECTION HEAD INCORPORATING THE SAME

(75) Inventors: Noriaki Okazawa, Nagano (JP); Munehide Kanaya, Nagano (JP); Tsuyoshi Kitahara, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 27 days.

(21) Appl. No.: 10/816,195

(22) Filed: Apr. 2, 2004

(65) Prior Publication Data

US 2004/0256955 A1    Dec. 23, 2004

(30) Foreign Application Priority Data

Apr. 4, 2003    (JP)    ............................ P2003-101874

(51) Int. Cl.
    *H01L 41/083*    (2006.01)
    *B41J 2/045*    (2006.01)
(52) U.S. Cl. ...................... 310/331; 310/328; 310/330; 310/332; 310/366; 347/68; 347/71; 347/70
(58) Field of Classification Search ................ 310/328, 310/364–366
    See application file for complete search history.

(56) References Cited

U.S. PATENT DOCUMENTS 5,072,240 A * 12/1991 Miyazawa et al. ............ 347/22

6,274,966 B1 * 8/2001 Kohno et al. ................ 310/328
6,747,396 B1 * 6/2004 Blom .......................... 310/328
6,747,398 B1 * 6/2004 Nakatani ..................... 310/328
6,943,483 B1 * 9/2005 Takeuchi et al. ............. 310/328

FOREIGN PATENT DOCUMENTS

JP    11-10875 A    1/1999

* cited by examiner

*Primary Examiner*—Darren Schuberg
*Assistant Examiner*—J. Aguirrechea
(74) *Attorney, Agent, or Firm*—Sughrue Mion, PLLC

(57) ABSTRACT

First internal electrode layers and second internal electrode layers are alternately laminated in a substrate while sandwiching piezoelectric material layer therebetween. The first internal electrode layers are exposed to a first end face of the substrate, and the second internal electrode layers are exposed to a second end face of the substrate which is opposite to the first end face. A first external electrode layer is formed on the first end face and a third end face connecting the first end face and the second end face. A second external electrode layer is formed on the second end face and the third end face. The second external electrode layer is electrically independent from the first external electrode layer. The first external electrode layer and the first internal electrode layers are to be divided by slits extending from the first end face to form a plurality of piezoelectric elements arrayed in a first direction. The second external electrode layer includes a pair of first sections provided on both end portions of the third end face in the first direction, and having a first dimension in a second direction perpendicular to the first direction, and a second section provided between the first sections, and having a second dimension in the second direction which is less than the first dimension.

8 Claims, 10 Drawing Sheets

PIEZOELECTRIC ELEMENT FORMATION MEMBER, METHOD OF MANUFACTURING THE SAME, PIEZOELECTRIC ACTUATOR UNIT AND LIQUID EJECTION HEAD INCORPORATING THE SAME

BACKGROUND OF THE INVENTION

The present invention relates to a piezoelectric element formation member comprising piezoelectric material layer which are deformable in accordance with the application of voltages, and a method of manufacturing such a piezoelectric element formation member. The present invention also relates to a piezoelectric actuator unit in which piezoelectric elements are arrayed and integrated with each other. The present invention also relates to a liquid ejection head incorporating such a piezoelectric actuator unit. For example, the present invention is directed to an ink jet recording head in which pressure fluctuation is caused to ink in pressure generating chambers by the piezoelectric elements to eject ink droplets from nozzle orifices.

It is known an ink jet recording head comprising a piezoelectric actuator unit of longitudinal vibration mode, wherein the piezoelectric elements are extended or shrunk in the axial direction thereof. In such a recording head, an actuation plate constitutes a part of the pressure generating chambers communicated with the nozzle orifices, so that the piezoelectric elements are deformed so as to actuate the actuation plate to generate the pressure fluctuation.

Japanese Patent Publication No. 11-10875A discloses such a piezoelectric actuator unit. As shown in FIGS. 8A and 8B, the piezoelectric actuator unit comprises a actuator array 19 and a fixation board 15 for supporting the actuator array 19. In the actuator array 19, a plurality of piezoelectric elements 14 are arrayed. Each of the piezoelectric elements 14 is a lamination type element in which internal common electrodes 11 and internal segment electrodes 12 are alternately laminated while sandwiching piezoelectric material layers 13 therebetween. The internal common electrodes are exposed to a rear end face of the actuator array 19, and the internal segment electrodes 12 are exposed to a front end face of the actuator array 19. On outer faces of the actuator array 19, there are formed external segment electrodes 16 electrically connected to the internal segment electrodes 12, and an external common electrode 17 electrically connected to the internal common electrodes 11. Terminals of a flexible cable 18 are mounted on contact portions of the external segment electrodes 16 and the external common electrodes 17 by soldering or the like.

Such a piezoelectric actuator unit is generally manufactured as explained below.

First, as shown in FIGS. 9A and 9B, a piezoelectric element formation member 23 is prepared. Specifically, the piezoelectric element formation member 23 is formed by alternately laminating conductive layers 21 to be the internal common electrodes 11 and conductive layers 20 to be the internal segment electrodes 12 while sandwiching piezoelectric material layers 22 therebetween, and then subjected to a drying process and a baking process. More specifically, the conductive layers 21 are exposed to a rear end face of the piezoelectric element formation member 23 and extended to the vicinity of a front end face thereof. On the other hand, the conductive layers 22 are exposed to the front end face of the piezoelectric element formation member 23.

Next, a mask 24 is placed on parts in a top face of the piezoelectric element formation member 23 where are to be boundaries of the external segment electrodes 16 and the external common electrode 17 and where to be dummy actuators (described later) arranged in both side ends of the actuator array 19. The mask 24 is thus generally U-shaped.

Next, as shown in FIGS. 10A and 10B, conductive material is vapor-deposited on outer faces of the piezoelectric element formation member 23 except side faces and a bottom face thereof, to form the external segment electrodes 16 and the external common electrode 17. The mask 24 is removed after the completion of the vapor deposition.

Next, a non-active region of the piezoelectric element formation member 23 in which only the internal common electrodes 11 and the piezoelectric material layers 13 are laminated (see FIG. 10B) is placed on the fixation board 15 made of, for example, metal and fixed thereon by adhesive agent.

After then, slits 25 are formed by cutter such as a dicing saw and a wire saw (not shown) so as to extend from the front end of the piezoelectric element formation member 23 to at least rear ends of the internal common electrodes 12, so that regions to be active regions of the piezoelectric elements 14 are pectinated. Incidentally, at the both side ends of the pectinated piezoelectric elements 14, a pair of dummy actuators having a larger width than that of each piezoelectric element 14 are formed.

In the above method, the external segment electrodes 16 and the external common electrode 17 are finished by executing a single vapor deposition process under such a condition that the mask 24 is provided on their boundaries. The external segment electrodes 16 and the external common electrode 17 must be electrically insulated because the piezoelectric action cannot be performed if both electrodes are electrically connected.

Recently, in view of the cost problem or the like, it is a trend that a portion which is not directly involved with the piezoelectric action is so designed as to have a smaller dimension. That is, the mask 24 is subjected to such downsizing. In such a case, the width of the mask 24 is narrowed and the stiffness thereof is lowered. Accordingly, the downsized mask 24 is likely to be flexed during the vapor deposition, so that a gap is formed between the surface of the piezoelectric element formation member 23 and the mask 24. If the conductive material enters the gap, the external segment electrodes 16 and the external common electrode 17 are electrically connected in the worst case. Such a gap is likely to be formed at a center portion of the mask 24 in the arrayed direction of the piezoelectric elements 14.

In the piezoelectric actuator unit, the contact portions of the external common electrode 17 with respect to the terminal of the flexible cable 18 are arranged at regions which are outer than the region where the external segment electrodes 16 are formed in the arrayed direction of the piezoelectric elements 14, because the contact portions must be arranged so as to avoid the wirings connected to the external segment electrodes 16. For this reason, it is not necessary to make the width of the external common electrode 17 uniform entirely as shown in FIG. 10A only if the contact portions for the flexible cable 18 are secured. In other words, the external common electrode 17 is formed even in unnecessary portions. Further, severe tolerance is imparted to a part the mask 24 corresponding to such an unnecessary portion.

These problems may occur not only in ink jet recording heads, but also similarly occur in other liquid ejection heads for ejecting liquid other than ink.

SUMMARY OF THE INVENTION

It is therefore an object of the invention to provide a piezoelectric element formation member advantageous to the downsizing requirement and the yield enhancement, by providing an external electrode at a functionally proper portion to alleviate the tolerance requirement.

It is also an object of the invention to provide a method of manufacturing such a piezoelectric element formation member.

It is also an object of the invention to provide a piezoelectric actuator unit and a liquid ejection head incorporating such a piezoelectric element formation member.

In order to achieve the above objects, according to the invention, there is provided a piezoelectric element formation member, comprising:

a substrate, in which first internal electrode layers and second internal electrode layers are alternately laminated while sandwiching piezoelectric material layer therebetween, the first internal electrode layers being exposed to a first end face of the substrate, and the second internal electrode layers being exposed to a second end face of the substrate which is opposite to the first end face;

a first external electrode layer formed on the first end face and a third end face connecting the first end face and the second end face, the first external electrode layer being electrically connected to the first internal electrode layers; and a second external electrode layer formed on the second end face and the third end face, the second external electrode layer being electrically connected to the second internal electrode layers, and being electrically independent from the first external electrode layer, wherein:

the first external electrode layer and the first internal electrode layers are to be divided by slits extending from the first end face to form a plurality of piezoelectric elements arrayed in a first direction; and the second external electrode layer includes:

a pair of first sections provided on both end portions of the third end face in the first direction, and having a first dimension in a second direction perpendicular to the first direction; and a second section provided between the first sections, and having a second dimension in the second direction which is less than the first dimension.

In order to form the above second external electrode layer, a mask having a widened portion corresponding to the narrowed second section is used when the external electrode layers are formed through the vapor deposition. Accordingly, the stiffness of the mask can be secured so that the undesired flexure during the vapor deposition is prevented even if the portion which is not involved with the piezoelectric action is downsized. Further, since the area of the unnecessary part of the second external electrode layer is reduced, it is advantageous to the cost reduction and the downsizing.

Preferably, the second dimension is substantially zero. In this case, the stiffness of the mask is further enhanced.

Preferably, a dimension of the second section in the first direction is greater than a dimension in the first direction of a region where the first external electrode layer is formed.

In such a configuration, a certain length between the external electrode layers can be secured.

Preferably, the first sections and the second section are connected in a stepwise manner.

Alternatively, it is preferable that the first sections and second section are connected by third portions each dimension in the second direction of which is gradually varied from the first dimension to the second dimension.

According to the invention, there is also provided a method of manufacturing a piezoelectric element formation member, comprising steps of:

preparing a substrate, in which first internal electrode layers and second internal electrode layers are alternately laminated while sandwiching piezoelectric material layer therebetween, the first internal electrode layers being exposed to a first end face of the substrate, and the second internal electrode layers being exposed to a second end face of the substrate which is opposite to the first end face;

placing a mask on a third end face of the substrate which connects the first end face and the second end face; and depositing conductive material on the masked substrate such that a first external electrode layer is formed on the first end face and the third end face, and a second external electrode layer is formed on the second end face and the third end face, and such that the second external electrode layer is made electrically independent from the first external electrode layer, wherein:

the first external electrode layer and the first internal electrode layers are to be divided by slits extending from the first end face to form a plurality of piezoelectric elements arrayed in a first direction; and the mask is configured such that the second external electrode layer includes:

a pair of first sections provided on both end portions of the third end face in the first direction, and having a first dimension in a second direction perpendicular to the first direction; and a second section provided between the first sections, and having a second dimension in the second direction which is less than the first dimension.

Preferably, the mask is configured such that the second dimension is substantially zero.

Preferably, the mask is configured such that a dimension of the second section in the first direction is greater than a dimension in the first direction of a region where the first external electrode layer is formed.

Preferably, the mask is configured such that the first sections and the second section are connected in a stepwise manner.

Alternatively, it is preferable that the mask is configured such that the first sections and the second section are connected by third portions each dimension in the second direction of which is gradually varied from the first dimension to the second dimension.

Preferably, the mask is configured such that a plurality of piezoelectric formation members each of which is described the above are simultaneously formed.

In such a configuration, the vapor deposition can be precisely executed even when a plurality of piezoelectric element formation members are simultaneously manufactured.

According to the invention, there is also provided a piezoelectric actuator unit, wherein a fourth end face opposite to the third end face of the above piezoelectric element formation member is joined to a fixation board in a cantilevered manner, such that a portion of the piezoelectric element formation member closer to the first end face becomes a free end.

Preferably, the slits are extended to at least an end of the first external electrode layer formed on the third end face and closer to the second end face.

According to the invention, there is also provided a liquid ejection head, comprising:

the above piezoelectric actuator unit;

a drive wiring, comprising a plurality of electrodes electrically connected, through contacts, to the divided ones of the first external electrode layer and the second external electrode layer, to supply signals for driving the piezoelectric elements; and a vibration plate, which forms a part of each of pressure generating chambers communicated with a nozzle orifice from which an ink droplet is ejected, wherein the second external electrode layer is electrically connected to at least two of the electrodes in the drive wiring via the first sections thereof.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE INVENTION

Figure 1A:
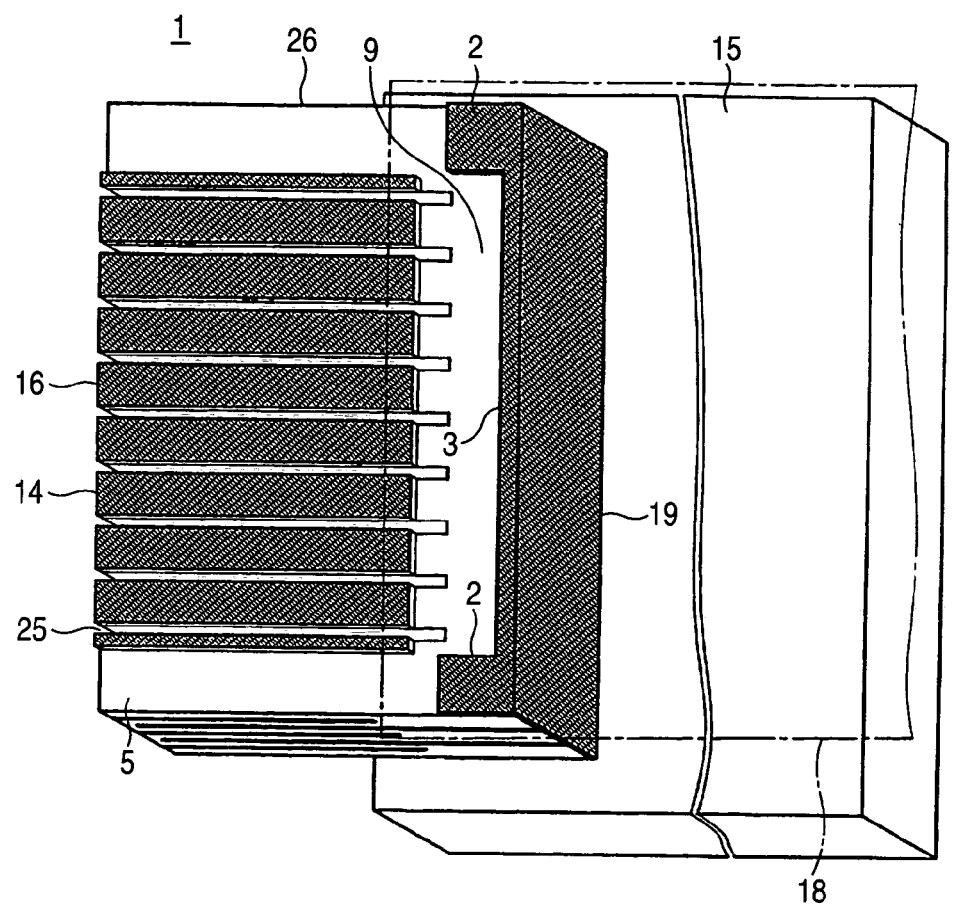
FIG. 1A is a perspective view of a piezoelectric actuator unit according to a first embodiment of the invention.

Preferred embodiments of the invention will be described below in detail with reference to the accompanying drawings. Members which are substantially the same as the related-art configuration shown in FIGS. 8A through 10B are designated by the same reference numerals.

Figure 1B:
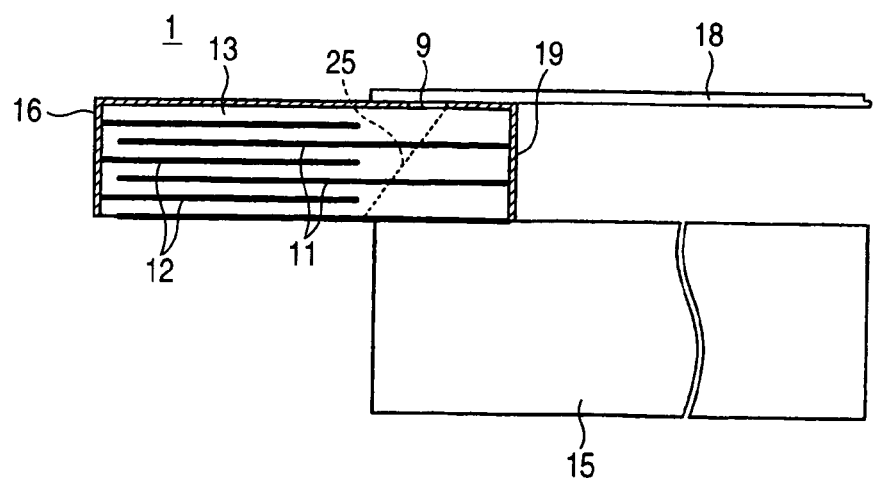
FIG. 1B is a side view of the piezoelectric actuator unit of FIG. 1A.

As shown in FIGS. 1A and 1B, a piezoelectric actuator unit 1 according to a first embodiment of the invention comprises a piezoelectric element formation member 23 and a fixation board for supporting the piezoelectric element formation member 23 thereon in a cantilevered manner. This piezoelectric actuator unit 1 is assembled in a liquid ejection head such as an ink jet recording head.

The piezoelectric element formation member 23 is formed by alternately laminating internal electrodes serving as two poles in a piezoelectric element 14 with piezoelectric material layers 13. Specifically, internal segment electrodes 12 to be segment electrodes each of which is electrically independent from an adjacent piezoelectric actuator, and internal common electrodes 11 to be a common electrode which is common to the respective piezoelectric actuators are alternately laminated while sandwiching the piezoelectric material layers 13 therebetween.

A plurality of slits 25 are formed in the piezoelectric element formation member 23 by a wire saw or the like. Each of the slits 25 is extended from the front end of the piezoelectric element formation member 23 at which the internal segment electrodes 12 to the rear ends of the internal segment electrodes 12. The front end portion of the piezoelectric element formation member 23 is pectinated by the slits 25 to form a plurality of arrayed piezoelectric elements 14. The bottom of each slit 25 is a slope as indicated by a dashed line shown in FIG. 1B.

At both side ends of the arrayed piezoelectric elements 14, a pair of dummy actuators 26 are formed so as to have a width wider than that of each piezoelectric element 14. The dummy actuators are not involved with the piezoelectric action for the liquid ejection, but serve as members for precisely positioning the piezoelectric actuator unit 1 when it is assembled in the liquid ejection head.

A region where the internal segment electrodes 12, the internal common electrodes 11 and the piezoelectric material layers 13 are laminated becomes an active region of the piezoelectric element 14. When voltage is applied between the internal segment electrodes 12 and the internal common electrodes 11, the piezoelectric material layers 13 deforms so that the piezoelectric element 14 extends or shrinks in the axial direction thereof. On the other hand, a region where the internal segment electrodes 12 are not provided becomes a non-active region which is not involved with the piezoelectric action and is fixed on the fixation board 15.

The internal segment electrodes 12 are exposed at a front end face of the piezoelectric element formation member 23 and electrically connected with external segment electrodes 16 describe later. On the other hand, the internal common electrodes 11 are exposed at a rear end face of the piezoelectric element formation member 23 and electrically connected with an external common electrodes 19. The internal common electrodes 11 are extended to the vicinity of the front end face of the piezoelectric element formation member 23.

Each of the external segment electrodes 16 is extended from the top face to the front end face of the piezoelectric element formation member 23, and electrically connected with a flexible cable 18 at the top face of he piezoelectric element formation member 23.

The external common electrodes 19 is extended from the top face to the rear end face of the piezoelectric element formation member 23.

At the boundaries between the external segment electrodes 16 and the external common electrodes 19, a no-electrode region 9 is formed so as to extend in the arrayed direction of the piezoelectric elements 14. Further, no-electrode regions 5 are formed at both widthwise ends of the top face of the piezoelectric element formation member 23 so as to continue to the no-electrode region 9.

A part of the no-electrode region 9 opposing to the external segment electrodes 16 is widened toward the rear end of the piezoelectric element formation member 23. This widened portion of the no-electrode region 9 defines widened portions 2 of the external common electrode 19 at the both widthwise ends of the top face of the piezoelectric element formation member 23. In other words, at the top face of the piezoelectric element formation member 23, the external common electrode 19 has the widened portions 2 and a narrowed portion 3 formed therebetween. A dimension of each widened portion 2 in the longitudinal direction of the piezoelectric element 14 is larger than that of the narrowed portion 3.

An interval between the widened portions 2, that is, a dimension of the no-electrode region 9 defining the widened portions 2 and the narrowed portion 3 in the arrayed direction of the piezoelectric elements 14 is wider than a dimension in the arrayed direction of the region where the external segment electrodes 16 are formed. The external common electrode 19 is electrically connected to the flexible cable 18 at the widened portions 2.

In the flexible cable 18, a plurality of printed wirings are arrayed along the arrayed direction of the piezoelectric elements 14. Wirings at both widthwise ends of the flexible cable 18 are electrically connected to the internal common electrodes 11 via the widened portions 2 of the external common electrode 19. On the other hand, wirings between the above wirings at both widthwise ends are electrically connected to the internal segment electrodes 12 via the external segment electrodes 16. In such a configuration, drive signals (voltages) are applied to the respective piezoelectric elements 14 through the flexible cable 18.

Figure 2:
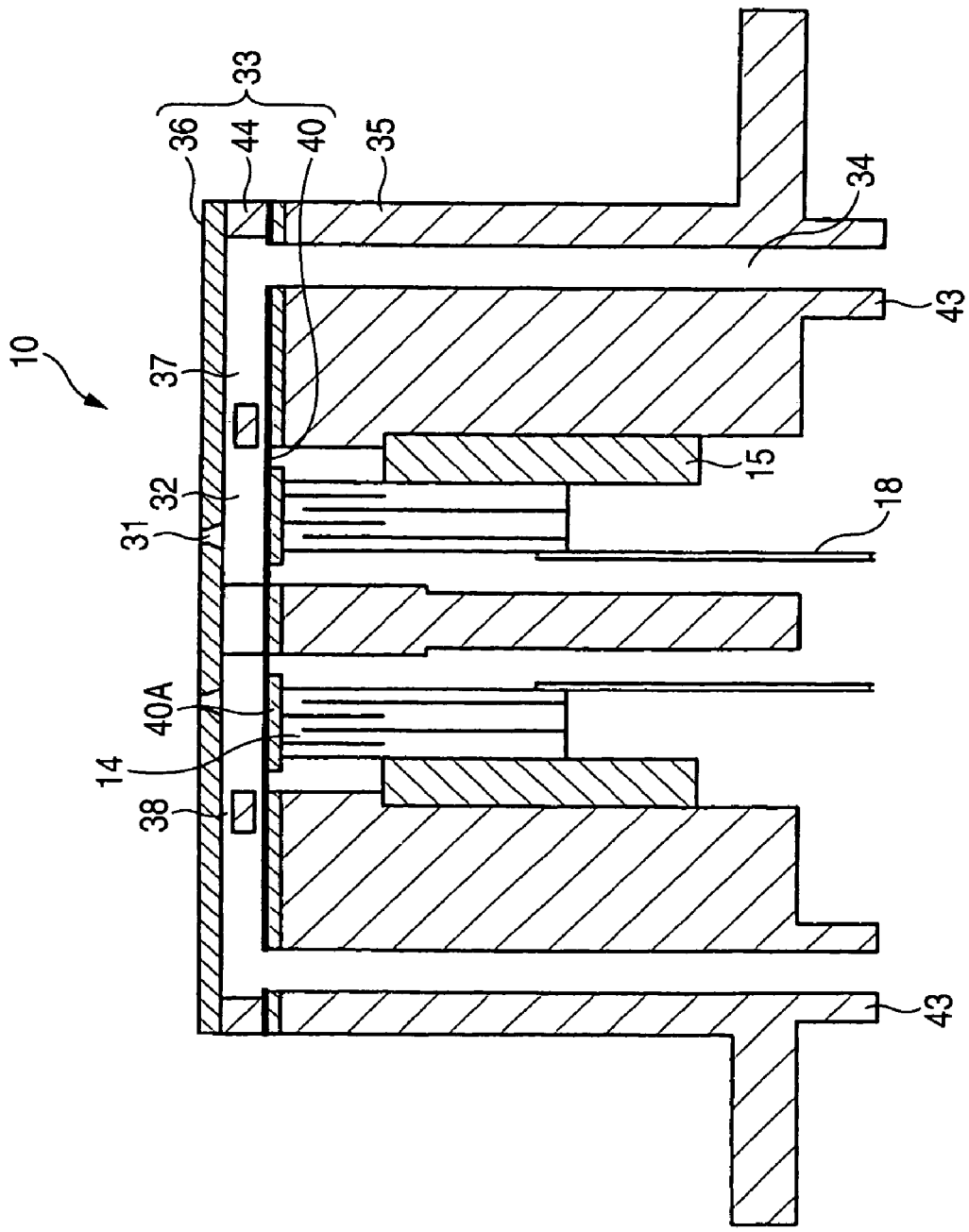
FIG. 2 is a section view of a liquid ejection head incorporating the piezoelectric actuator unit of FIG. 1A.

FIG. 2 shows one example of a liquid ejection head 10 incorporating the above piezoelectric actuator unit 1.

The liquid ejection head 10 is constituted by joining a flow passage unit 33 formed with nozzles 31 and pressure generating chambers 32 with a head case 35 accommodating the piezoelectric actuator unit 1.

The flow passage unit 33 is formed by laminating: a nozzle plate 36 formed with the nozzles 31; a flow passage formation plate 44 in which opened spaces to be the pressure generating chambers 32, a common reservoir 37 and liquid supply paths 38 communicating the chambers 32 to the reservoir 37 are formed; and an actuation plate 40 which closes the opened space of the flow passage formation plate 44.

The piezoelectric element 14 shrinks in the axial (longitudinal) direction thereof when it is charged, whereas it extends when it is discharged. The front ends (free ends) of the piezoelectric elements 14 are fixed on island portions 40A of the actuation plate 40 to vary the volume of the pressure generating chamber 32.

In accordance with the extension or shrinkage of the piezoelectric elements 14, the pressure generating chambers 32 are expanded or contracted to generate pressure fluctuation in liquid contained in the pressure generating chambers 32, thereby pulling liquid from the reservoir 37 or ejecting liquid from the nozzles 31.

The head case 35 is formed with a liquid supply passage 34 for introducing liquid such as ink to the reservoir 37. A liquid supply tube 43 is formed at the end of the liquid supply passage 34.

Next, there will be described how to manufacture the above piezoelectric actuator unit 1.

Figure 3A:
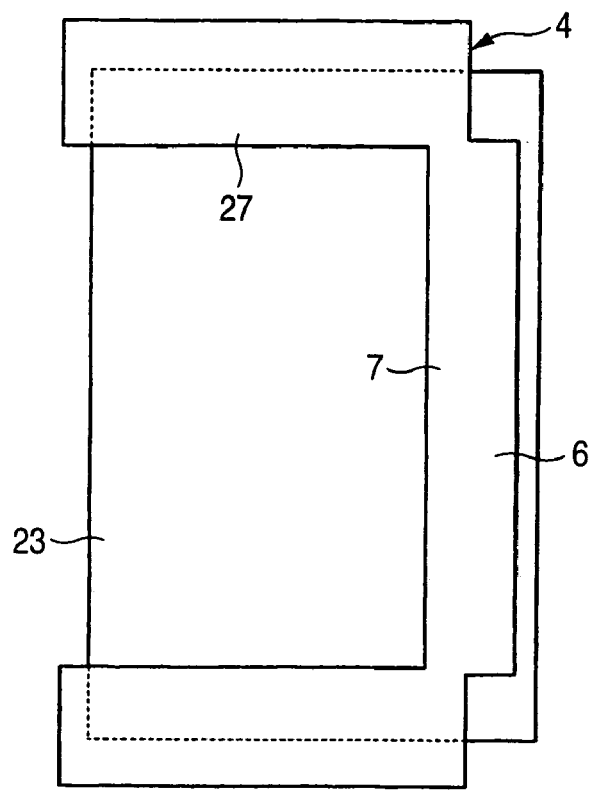
FIGS. 3A and 4A are plan views showing how to manufacture the piezoelectric actuator unit of FIG. 1A.
Figure 3B:
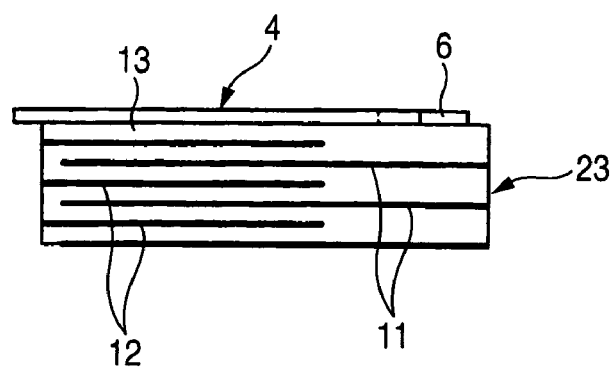
FIGS. 3B and 4B are side views showing how to manufacture the piezoelectric actuator unit of FIG. 1A.

First, as shown in FIGS. 3A and 3B, the piezoelectric element formation member 23 in which the internal segment electrodes 12 and the internal common electrodes 11 are alternately laminated while sandwiching the piezoelectric material layers 13 is prepared. More specifically, conductive material sheets to be the internal segment electrodes 12 and conductive material sheets to be the internal common electrodes 11 are alternately laminated while sandwiching piezoelectric material sheets such as titanate lead zirconate (PZT) to be the piezoelectric material layers 13 therebetween. The laminated structure is then subjected to a baking process. In this state, the internal segment electrodes 12 are exposed to the front end face of the piezoelectric element formation member 23 to be the free end, while the internal common electrodes 11 are exposed to the rear end face of the piezoelectric element formation member 23 to be the fixed end.

Next, a mask 4 made of stainless steel or the like is placed on the top face of the piezoelectric element formation member 23. The mask 4 has a band section 7 for forming the no-electrode region 9 between the regions to be the external segment electrodes 16 and the external common electrode 19. The band section 7 extends in the arrayed direction of the piezoelectric elements 14 and has a protruded portion 6 protruded toward the rear end of the piezoelectric element formation member 23.

The mask 4 has side end portions 27 which are continued from both ends of the band section 7 to the front end of the piezoelectric element formation member 23 via the both widthwise end portions thereof. An interval between the side end portions 27 in the arrayed direction of the piezoelectric elements 14 is made smaller than a dimension of the protruded portion 6 in the arrayed direction of the piezoelectric elements 14.

Figure 4A:
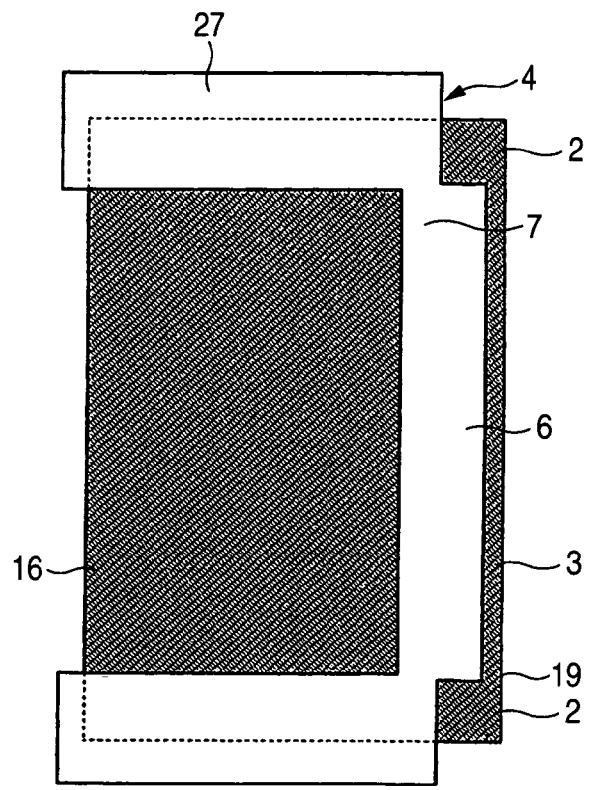
Figure 4B:
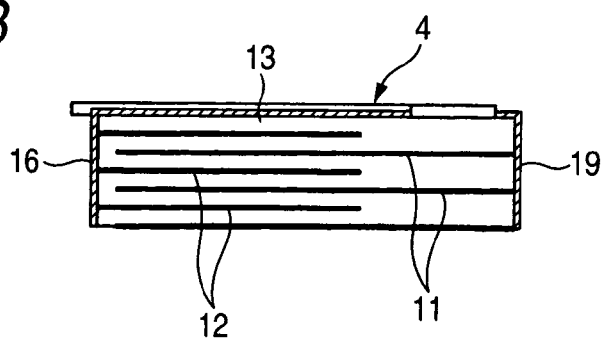

Next, as shown in FIGS. 4A and 4B, in a condition that the mask 4 is placed on the top face of the piezoelectric element formation member 23, conductive material such as chromium, nickel, gold, platinum, copper or the like is deposited, so that the external segment electrodes 16 and the external common electrode 19 are formed at portions where are not covered with the mask 4, while the no-electrode regions 5, 9 are formed at portions where are covered with the mask 4.

Figure 4C:
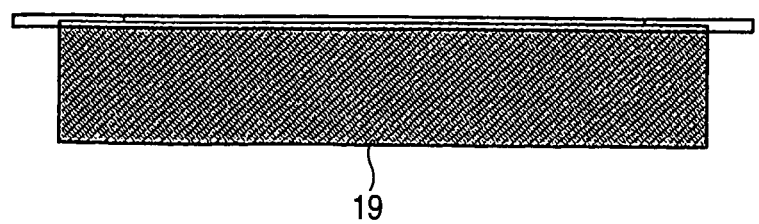
FIG. 4C is a rear side view showing how to manufacture the piezoelectric actuator unit of FIG. 1A.

The thus formed external common electrode 19 has the above described widened portions 2 and the narrowed portion 3. As shown in FIG. 4B, the external segment electrodes 16 are extended from the top face to the front end face of the piezoelectric element formation member 23 and electrically connected to the exposed internal segment electrodes 12. As shown in FIGS. 4B and 4C, the external common electrode 19 is extended from the top face to the rear end face of the piezoelectric element formation member 23 and electrically connected to the exposed internal common electrodes 11.

After the non-active region of the piezoelectric element formation member 23 is fixed on the fixation board 15, the slits 25 are formed by the wire saw or the like to form the pectinated piezoelectric elements 14 as shown in FIGS. 1A and 1B.

In this embodiment, since the external common electrode 19 on the top face of the piezoelectric element formation member 23 is configured to have the widened portions 2 and the narrowed portion 3, the mask 4 for forming the no-electrode region 9 is formed with the protruded portion 6.

Thus, the stiffness of the mask 4 is enhanced, so that the undesired flexure of the mask 4 during the vapor deposition process can be avoided. The trouble that the deposited conductive material enters the gap formed by the flexure can be accordingly prevented. Therefore, even if the non-active region is subjected to the downsizing, the stiffness of the mask 4 can be maintained, thereby enhancing the yield.

In this embodiment, the external common electrode 19 is electrically connected with the flexible cable 18 via the widened portions 2. The portion where is not used as the contact portions for the flexible cable 18 is provided as the narrowed portion 3. In other words, the external common electrode 19 is not formed at the unnecessary portion.

Further, since the protruded portion 6 is relatively wide, the severe tolerance is not required for the mask 4.

In this embodiment, the interval between the widened portions 2 in the arrayed direction of the piezoelectric elements 14 is wider than the dimension of the region where the external segment electrodes 16 are formed in the arrayed direction of the piezoelectric elements 14. Accordingly, a certain distance between both of the external electrodes can be secured, so that the stiffness of the mask 4 can be secured. Further, a space for a reinforcing jig or the like can be secured on the mask 4.

Figure 5:
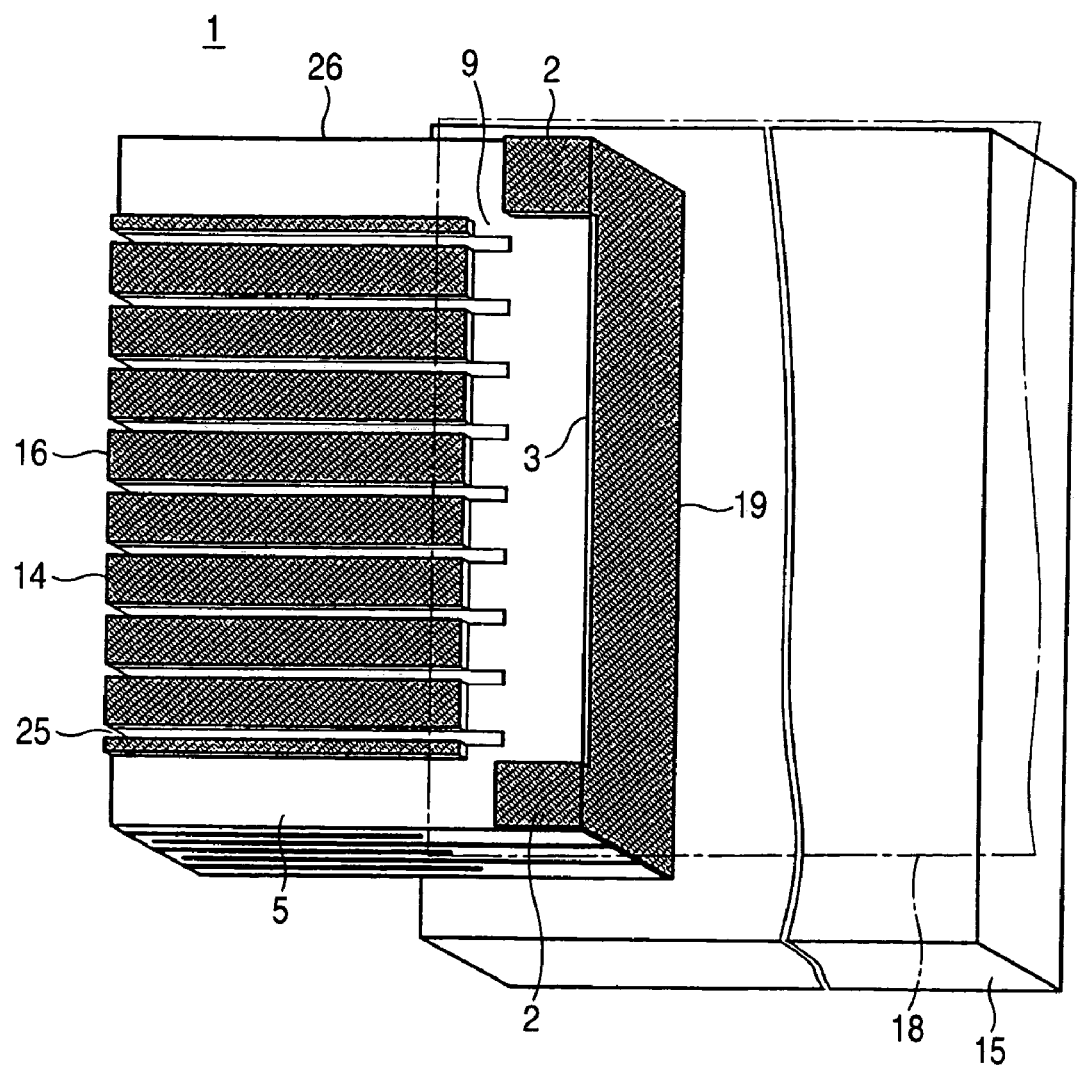
FIG. 5 is a perspective view of a piezoelectric actuator unit according to a second embodiment of the invention.

FIG. 5 shows a piezoelectric actuator unit according to a second embodiment of the present invention.

In this embodiment, the band section 7 of the mask 4 is formed with a protruded portion 6 which extends to the rear end of the piezoelectric element formation member 23. Accordingly, the narrowed portion 3 of the external common electrode 19 is formed as a region which is provided on the rear end face of the piezoelectric element formation member 23, but is not provided on the top face thereof.

In such a configuration, the stiffness of the band section 7 is further enhanced, while further reducing the area of the unnecessary part of the external common electrode 19.

Figure 6:
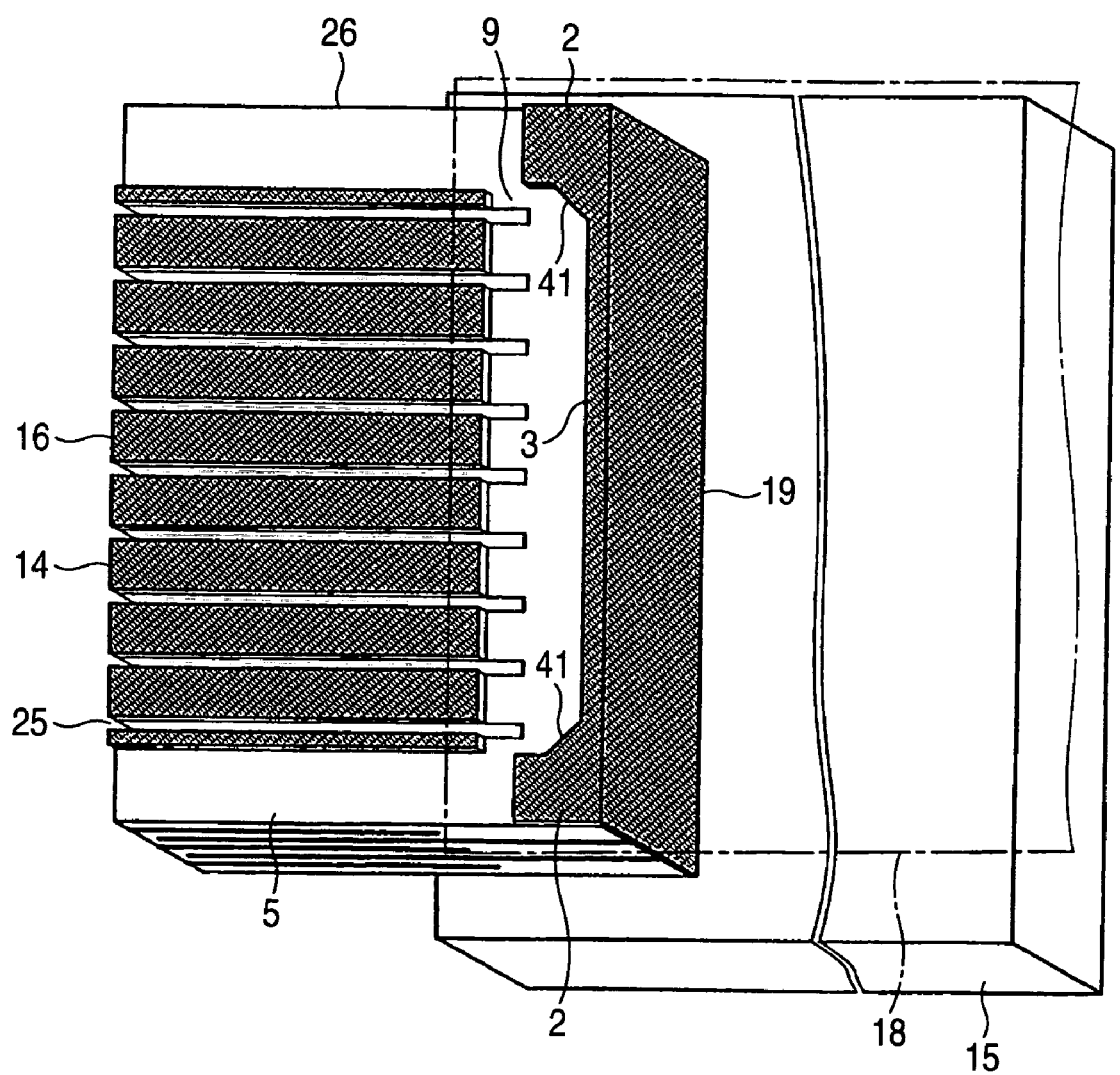
FIG. 6 is a perspective view of a piezoelectric actuator unit according to a third embodiment of the invention.

FIG. 6 shows a piezoelectric actuator unit according to a third embodiment of the present invention.

In this embodiment, the widened portions 2 and the narrowed portion 3 are connected via portions 41 at which the width of the external common electrode 19 in the longitudinal direction of the piezoelectric element 14 is gradually varied. FIG. 6 show an example that the width at the portion 41 is linearly varied. However, the portion 41 may have a curved edge.

In this embodiment, the largest interval between the widened portions 2 in the arrayed direction of the piezoelectric elements 14 is made larger than the dimension of the region where the external segment electrodes 16 are formed in the arrayed direction of the piezoelectric elements 14.

In such a configuration, the area of the contact portions of the external common electrode 19 with respect to the flexible cable 18 can be enlarged, so that the tolerance requirement for parts of the mask 4 for forming the contact portions can be alleviated. Any other attained advantages are the same as discussed with the above embodiments.

Figure 7:
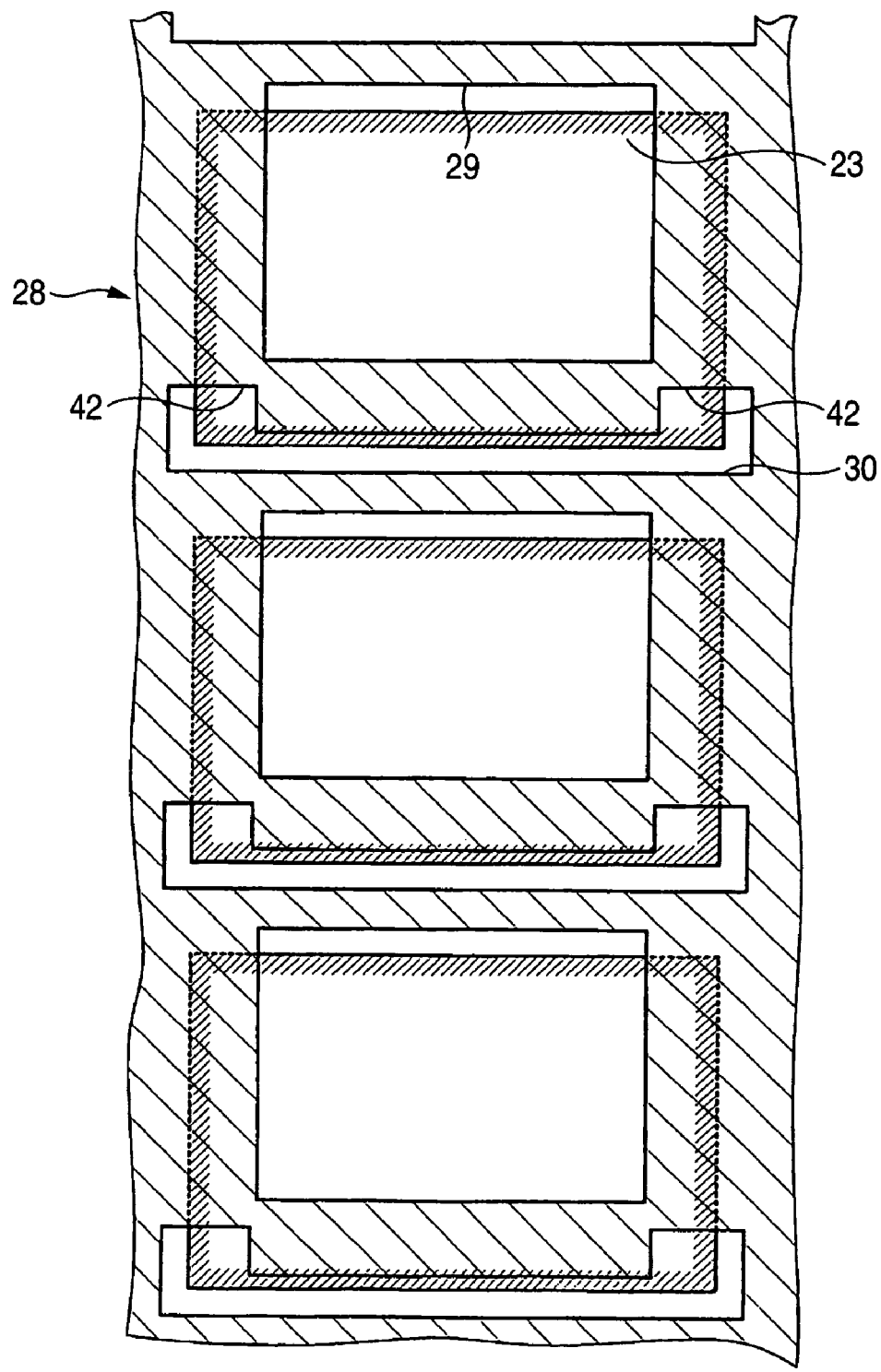
FIG. 7 is a plan view showing how to manufacture a plurality of piezoelectric actuator units of the invention.
Figure 8A:
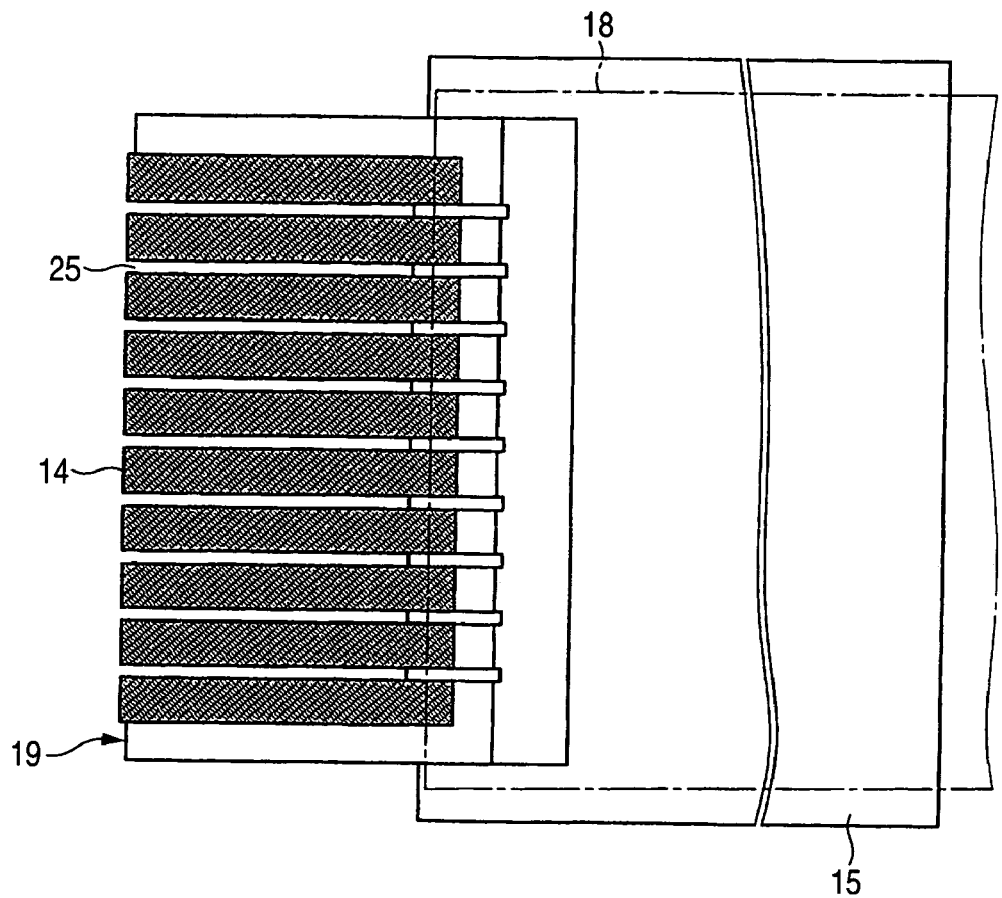
FIG. 8A is a plan view of a related-art piezoelectric actuator unit.
Figure 8B:
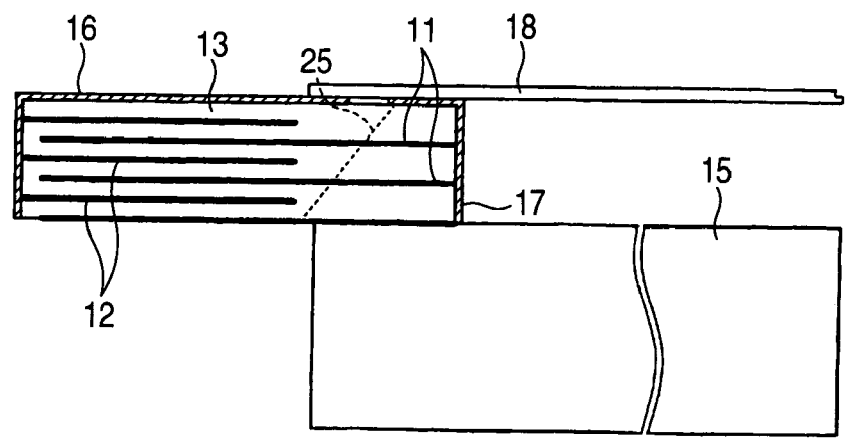
FIG. 8B is a side view of the piezoelectric actuator unit of FIG. 8A.
Figure 9A:
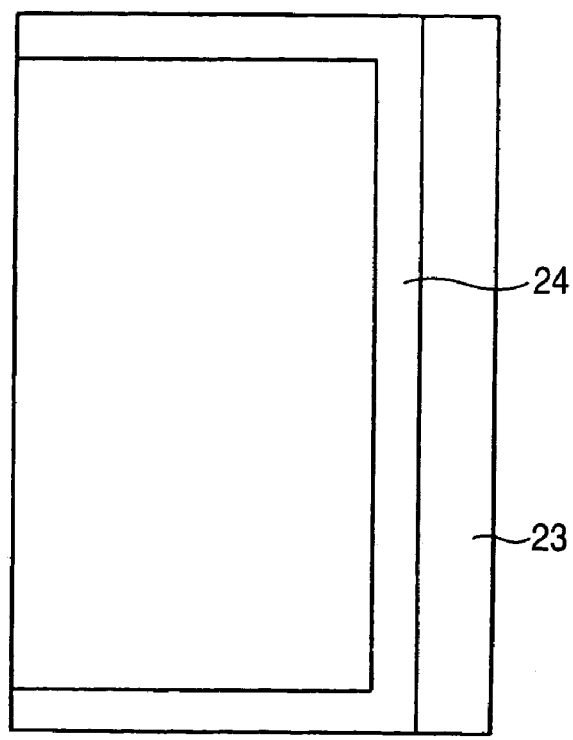
FIGS. 9A and 10A are plan views showing how to manufacture the piezoelectric actuator unit of FIG. 8A.
Figure 9B:
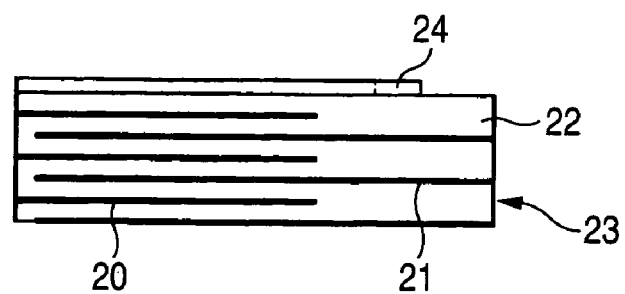
FIGS. 9B and 10B are side views showing how to manufacture the piezoelectric actuator unit of FIG. 8A.
Figure 10A:
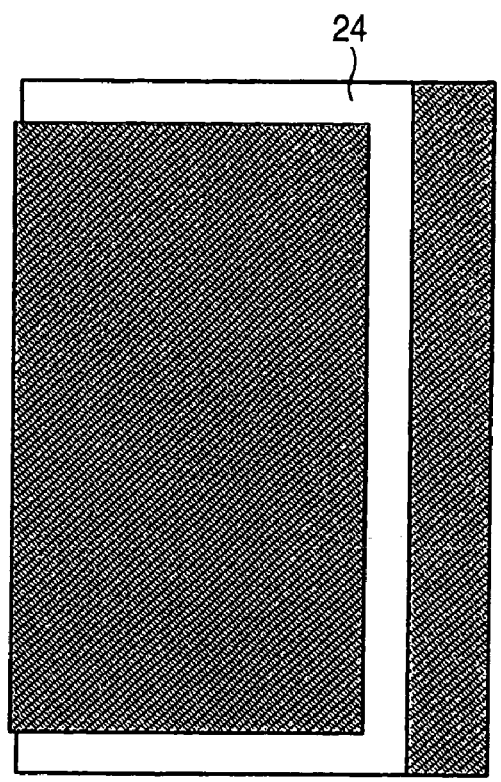
Figure 10B:
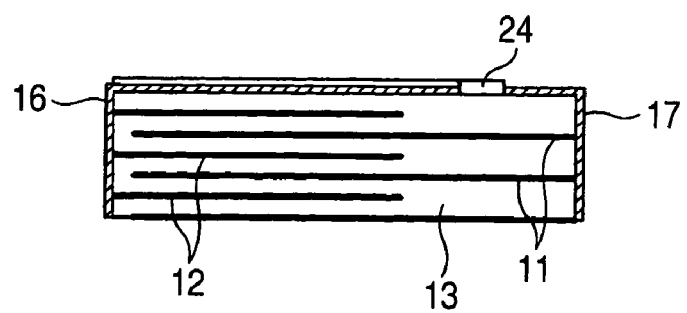

FIG. 7 shows how to manufacture a plurality of piezoelectric actuator units simultaneously. Specifically, a plurality of piezoelectric element formation members 23 explained in the first embodiment are arrayed such that the rear end face (lower side in the figure) of one formation member 23 faces the front end face (upper side in the figure) of adjacent one formation member 23. In this example, three formation members 23 are arrayed.

A mask 28 covers simultaneously the arrayed piezoelectric element formation members 23. The mask 28 is formed with first openings 29 for forming the external segment electrodes 16 and second openings 30 for forming the external common electrodes 19.

A part partitioning the first opening 29 and the second opening 30 serves as the above described band section 7. Both side portions of the first opening 29 serve as the above described side end portions 27.

The second opening 30 is formed with widened portions 42 extended toward the first opening 29 at both ends of the second opening 30 in order to form the widened portions 2.

In a state that the mask 28 is placed on the top faces of the piezoelectric element formation members 23, the conductive material is deposited thereon, so that the external segment electrodes 16 and the external common electrodes 19 are formed at portions where is not covered with the mask 28.

After the non-active region of each piezoelectric element formation member 23 is fixed on the fixation board 15, the slits 25 are formed by the wire saw or the like to form the pectinated piezoelectric elements 14 as shown in FIGS. 1A and 1B.

In such a configuration, the vapor deposition can be executed with high accuracy even when the plural piezoelectric element formation members 23 are subjected to the vapor deposition.

In the above embodiment, the ink jet recording head is exemplified as the liquid ejection head. As another examples of the liquid ejection head, there may be exemplified a recording head installed in an image forming apparatus such as a printer, a coloring material ejection head used for manufacturing a color filter installed in a liquid crystal display or the like, an electrode material ejection head used for forming electrodes installed in an organic EL display, a field emission display or the like, and an organic compound ejection head used for manufacturing a biochip.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A piezoelectric element formation member, comprising:

a substrate, in which first internal electrode layers and second internal electrode layers are alternately laminated while sandwiching piezoelectric material layer therebetween, the first internal electrode layers being exposed to a first end face of the substrate, and the second internal electrode layers being exposed to a second end face of the substrate which is opposite to the first end face;

a first external electrode layer formed on the first end face and a third end face connecting the first end face and the second end face, the first external electrode layer being electrically connected to the first internal electrode layers; and a second external electrode layer formed on the second end face and the third end face, the second external electrode layer being electrically connected to the second internal electrode layers, and being electrically independent from the first external electrode layer, wherein:

the first external electrode layer and the first internal electrode layers are to be divided by slits extending from the first end face to form a plurality of piezoelectric elements arrayed in a first direction; and the second external electrode layer includes:

a pair of first sections provided on both end portions of the third end face in the first direction, and having a first dimension in a second direction perpendicular to the first direction; and a second section provided between the first sections, and having a second dimension in the second direction which is less than the first dimension.

2. The piezoelectric element formation member as set forth in claim 1, wherein the second dimension is substantially zero.

3. The piezoelectric element formation member as set forth in claim 1, wherein a dimension of the second section in the first direction is greater than a dimension in the first direction of a region where the first external electrode layer is formed.

4. The piezoelectric element formation member as set forth in claim 1, wherein the first sections and the second section are connected in a stepwise manner.

5. The piezoelectric element formation member as set forth in claim 1, wherein the first sections and the second section are connected by third portions each dimension in the second direction of which is gradually varied from the first dimension to the second dimension.

6. A piezoelectric actuator unit, wherein a fourth end face opposite to the third end face of the piezoelectric element formation member as set forth in claim 1 is joined to a fixation board in a cantilevered manner, such that a portion of the piezoelectric element formation member closer to the first end face becomes a free end.

7. The piezoelectric actuator unit as set forth in claim 6, wherein the slits are extended to at least an end of the first external electrode layer formed on the third end face and closer to the second end face.

8. A liquid ejection head, comprising:
the piezoelectric actuator unit as set forth in claim 6;
a drive wiring, comprising a plurality of electrodes electrically connected, through contacts, to the divided ones of the first external electrode layer and the second external electrode layer, to supply signals for driving the piezoelectric elements; and
a vibration plate, which forms a part of each of pressure generating chambers communicated with a nozzle orifice from which an ink droplet is ejected,
wherein the second external electrode layer is electrically connected to at least two of the electrodes in the drive wiring via the first sections thereof.

* * * * *